United States Patent
Wang et al.

(10) Patent No.: US 7,405,151 B2
(45) Date of Patent: Jul. 29, 2008

(54) METHOD FOR FORMING A SEMICONDUCTOR DEVICE

(75) Inventors: Gin Jei Wang, Changhua (TW);
Chao-Hsien Peng, Hsinchu City (TW);
Chii-Ming Wu, Hsinchu Hsien (TW);
Chih-Wei Chang, Hsinchu Hsien (TW);
Shau-Lin Shue, Hsinchu City (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 189 days.

(21) Appl. No.: 11/420,900

(22) Filed: May 30, 2006

(65) Prior Publication Data

US 2006/0205235 A1    Sep. 14, 2006

Related U.S. Application Data

(62) Division of application No. 11/002,331, filed on Dec. 1, 2004, now Pat. No. 7,078,810.

(51) Int. Cl.
*H01L 21/4763* (2006.01)

(52) U.S. Cl. ............... 438/622; 438/672; 438/637; 438/620; 438/E21.17

(58) Field of Classification Search ......... 438/637–638, 438/672–673, 618–624
See application file for complete search history.

(56) References Cited

U.S. PATENT DOCUMENTS

| | | | |
|---|---|---|---|
| 6,093,628 | A | 7/2000 | Lim et al. |
| 6,181,012 | B1 | 1/2001 | Edelstein et al. |
| 6,291,885 | B1 | 9/2001 | Cabral et al. |
| 2002/0121699 | A1 | 9/2002 | Cheng et al. |
| 2003/0082301 | A1 | 5/2003 | Chen et al. |
| 2004/0152307 | A1* | 8/2004 | Pan et al. ............ 438/687 |
| 2005/0277292 | A1 | 12/2005 | Peng et al. |
| 2007/0099415 | A1* | 5/2007 | Chen et al. ............ 438/622 |

OTHER PUBLICATIONS

China Search Report mailed Apr. 6, 2007.

* cited by examiner

*Primary Examiner*—Dung A. Le
(74) *Attorney, Agent, or Firm*—Thomas, Kayden, Horstemeyer & Risley

(57) ABSTRACT

A method for forming a semiconductor device is described. An opening is formed in a first dielectric layer, exposing an active region of the transistor, and an atomic layer deposited (ALD) TaN barrier is conformably formed in the opening, at a thickness less than 20 Å. A copper layer is formed over the atomic layer deposited (ALD) TaN barrier to fill the opening.

10 Claims, 4 Drawing Sheets

METHOD FOR FORMING A SEMICONDUCTOR DEVICE

This application is a division of pending U.S. patent application Ser. No. 11/002,331, filed Dec. 1, 2004 and entitled "SEMICONDUCTOR DEVICE AND FABRICATION METHOD THEREOF," now U.S. Pat. No. 7,078,810.

BACKGROUND

The present invention relates to semiconductors, and in particular to a semiconductor device with a copper contact or interconnect having TaN barrier at minimal thickness and fabrications thereof.

Electrically conductive lines providing, for example, signal transfer are essential in electronic devices as well as semiconductor integrated circuit (IC) devices. Electrically conductive lines on different levels are connected by electrically conductive plugs in required position, providing a predetermined function.

Recently, fabrication using copper has been introduced to solve problems such as RC delay caused by feature size reduction responding to demands for increased integrity. Moreover, copper shows better heat conductivity, providing better electromigration (EM) resistance than conventional aluminum. Copper fabrication compatible with low-k dielectric material has become a popular interconnect process.

Nevertherless, one disadvantage of the copper fabrication is diffusion of copper to adjacent dielectric material, affecting reliability of the IC device. A metal barrier layer comprising material such as tantalum (Ta) or tantalum nitride (TaN) is thus provided for diffusion suppression. However, the tantalum (Ta) or tantalum nitride (TaN) barrier is normally formed by PVD such as sputtering at a thickness exceeding 100 Å.

Due to the critical dimension (CD) reduction of semiconductor devices, copper contacts, such as copper contact plugs are required in the front-end fabrication to electrically contact the active regions formed on a semiconductor substrate or a gate electrode of a transistor. Hence, thinner and more reliable diffusion barriers are needed to prevent undesired copper diffusion.

SUMMARY

Accordingly, embodiments of the invention provide a semiconductor device, comprising a substrate with at least one transistor formed thereon. A first dielectric layer covers the transistor and has an opening in the first dielectric layer to expose an active region of the transistor. An atomic layer deposited (ALD) TaN barrier is conformably formed in the opening, at a thickness less than 20 Å. A copper layer is formed over the atomic layer deposited (ALD) TaN barrier to fill the opening.

A method for forming a semiconductor device is also provided, in which a substrate with at least one transistor covered by a first dielectric layer is provided. An opening is formed in the first dielectric layer to expose an active region of the transistor. A TaN barrier layer is conformably formed at a thickness less than 20 Å in the opening by atomic layer deposition (ALD) and a copper layer is formed over the TaN barrier layer to fill the opening.

A detailed description is given in the following with reference to the accompanying drawings.

BRIEF DESCRIPTION OF THE DRAWINGS

The present invention can be more fully understood by reading the subsequent detailed description and examples with references made to the accompanying drawings, wherein.

DESCRIPTION

In this specification, expressions such as "overlying the substrate", "above the layer", or "on the film" simply denote a relative positional relationship with respect to the surface of the base layer, regardless of the existence of intermediate layers. Accordingly, these expressions may indicate not only the direct contact of layers, but also, a non-contact state of one or more laminated layers. By use of the term "low dielectric constant" or "low-k" herein, is meant a dielectric constant (k value) which is less than the dielectric constant of a conventional silicon oxide. Preferably, the dielectric constant of the low-k is less than about 3.9.

Figure 1:
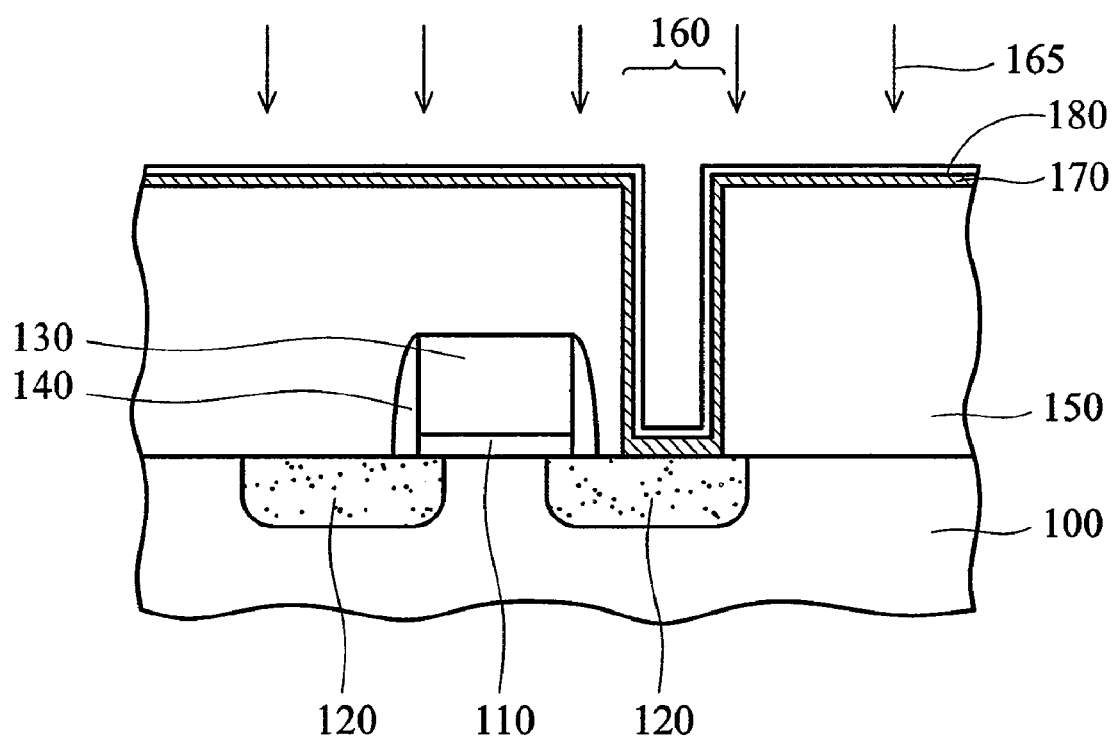
FIGS. 1, 3-6 are cross sections of a method for forming a semiconductor device with a copper interconnect and a copper contact according to an embodiment of the invention.

Fabrication of a semiconductor device with copper contacts according to embodiments of the invention is shown in following cross sections of FIGS. 1-6. In FIG. 1, a substrate 100, such as a silicon substrate, is first provided with a transistor formed thereon. The transistor comprises a gate insulating layer 110 and a gate electrode 130 sequentially formed over a portion of the substrate 100, functioning as a gate stack, and the gate electrode 130 is insulated from the substrate 100 by the gate insulating layer 110. The transistor further comprises a pair of source/drain regions 120 oppositely disposed in the substrate 100 adjacent to the gate electrode 130. Preferably, the gate electrode 130 is polysilicon and can be doped with impurities of suitable conductive type, and the source/drain regions 120 are N type or P type doped. Further, the transistor comprises insulating spacers 140 formed on opposite sidewalls of the gate stack, respectively.

A first dielectric layer 150, preferably a phosphorous-containing dielectric layer of phosphosilicate glass (PSG) or borophosphosilicate glass (BPSG), is formed over the substrate 100 and the transistor with an opening 160 formed therein. The opening 160 can be formed at a position related to one of the active regions such as the source/drain region 120 or the gate electrode 130 of the transistor. Herein, as shown in FIG. 1, the opening 160 formed in a position corresponding to one of the source/drain regions 120, exposing the top surface thereof is given as an example but is not restricted thereto.

Next, a tantalum nitride (TaN) barrier layer 170 at a thickness less than 20 Å is comfortably formed over the first dielectric layer 150 and in the opening 160. Thickness of the tantalum nitride (TaN) barrier layer 170 is preferably between 0~50 Å and is formed by an atomic layer deposition (ALD) 165. The atomic layer deposition 165 can be performed by an atomic layer deposition cluster tool having multiple chambers (not shown). The TaN barrier layer 170 shows good step coverage in the opening 160 and enhanced electromigration resistance in a later formed conductive contact. Next, a thin copper seed layer 180 at a thickness of about 500~1800 Å is then formed over the TaN barrier layer 170. The atomic layer deposition 165 will be further discussed later.

Figure 2:
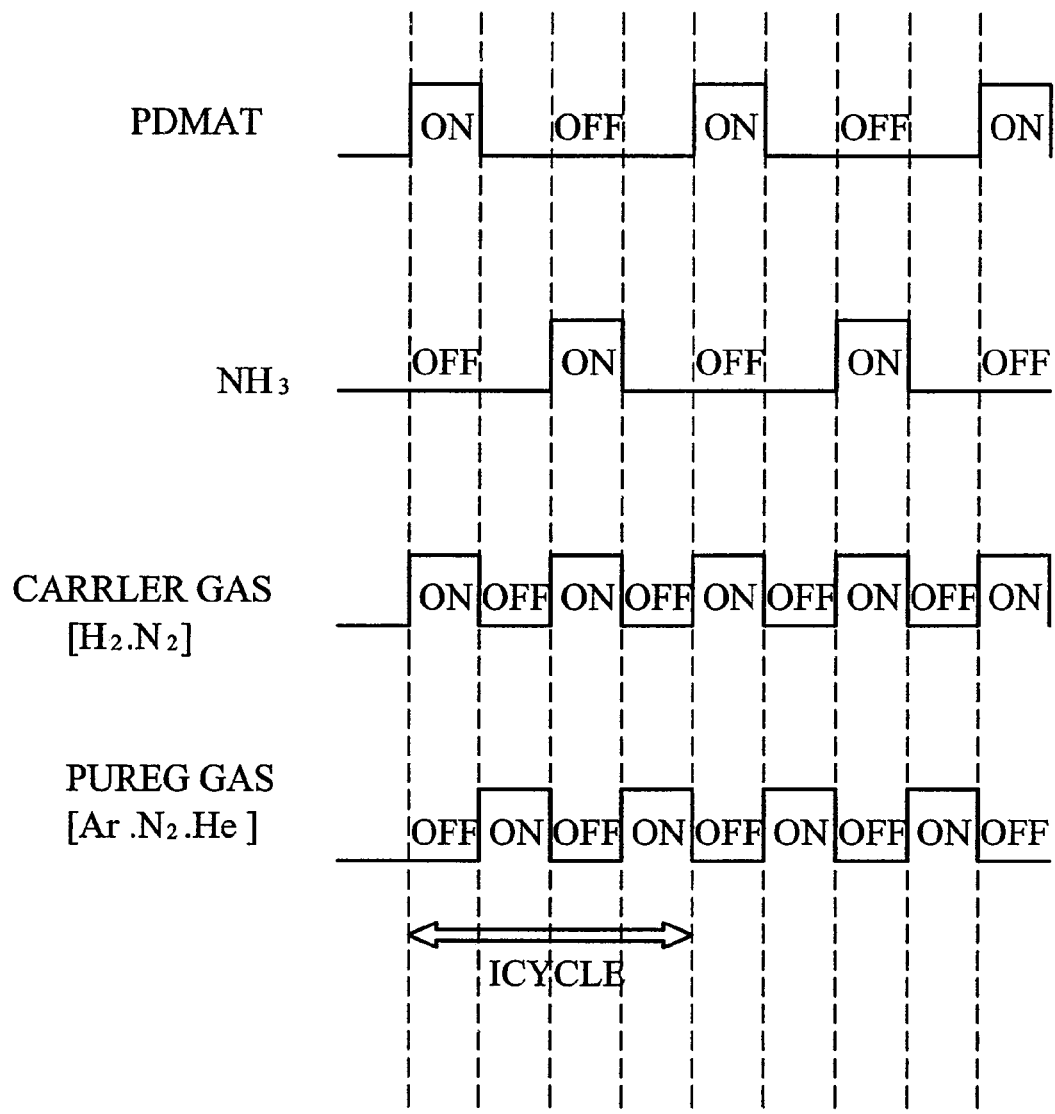
FIG. 2 shows an exemplary method of injecting source and purge gases in atomic layer deposition 165 of FIGS. 1.

FIG. 2 shows an exemplary method for injecting gaseous reactants, purge gases and carrier gas during the atomic layer deposition 165. The atomic layer deposition 165 is performed by an atomic layer deposition (ALD) cluster tool having multiple process chambers at process pressure of about 0~5 torr and at process temperature less than 300° C. When forming the TaN barrier layer 170, reactants used in the atomic layer deposition 165 include penta-dimethyl-amino-tantalum (PDMAT) and ammonia ($NH_3$) with flow rates of about 0~100 sccm and 0~10 sccm per injunction, respectively. Further, carrier gas such as hydrogen ($H_2$) or nitrogen ($N_2$) at a flow rate between 0~10 sccm is also used to carry the described reactants of the ALD deposition 165 into the process chamber. Moreover, gases such helium, nitrogen and argon with a total flow rate between 0~100 sccm are used to purge reactants remaining in the process chamber. As shown in FIG. 2, a cycle of PDMAR—$NH_3$ in cooperation with purge operations is performed by injecting a purge gas in pulses between the injection pulses. Thus a TaN layer 170 under a formation rate of about 1~3 Å/per cycle. The pulse-on time for the source gas is about 0.01~0.001 seconds. The TaN barrier layer 170 can thus be formed by at least described cycles.

Figure 3:
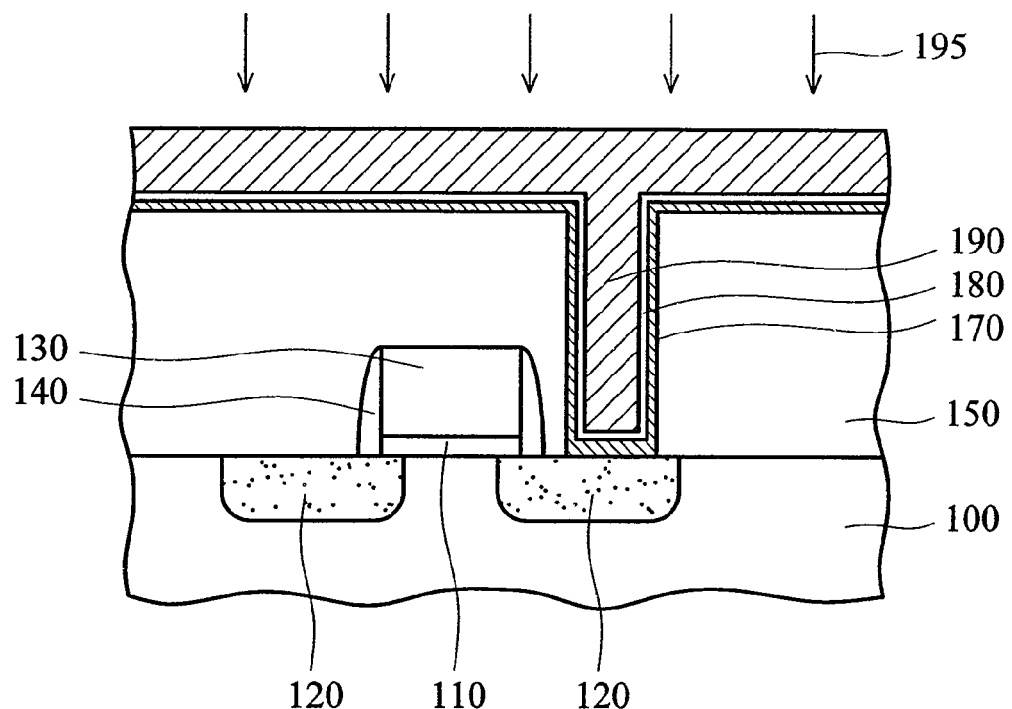

Next, in FIG. 3, a thicker copper layer 190 is formed over the copper seed layer 170 and fills the opening by deposition 195. The deposition 195 can be performed by an electrochemical plating (ECP) or an electroless plating. Due to the formation of the TaN barrier layer 170, diffusion of the copper layer may be prevented and contact resistance reduced thereby.

Figure 4:
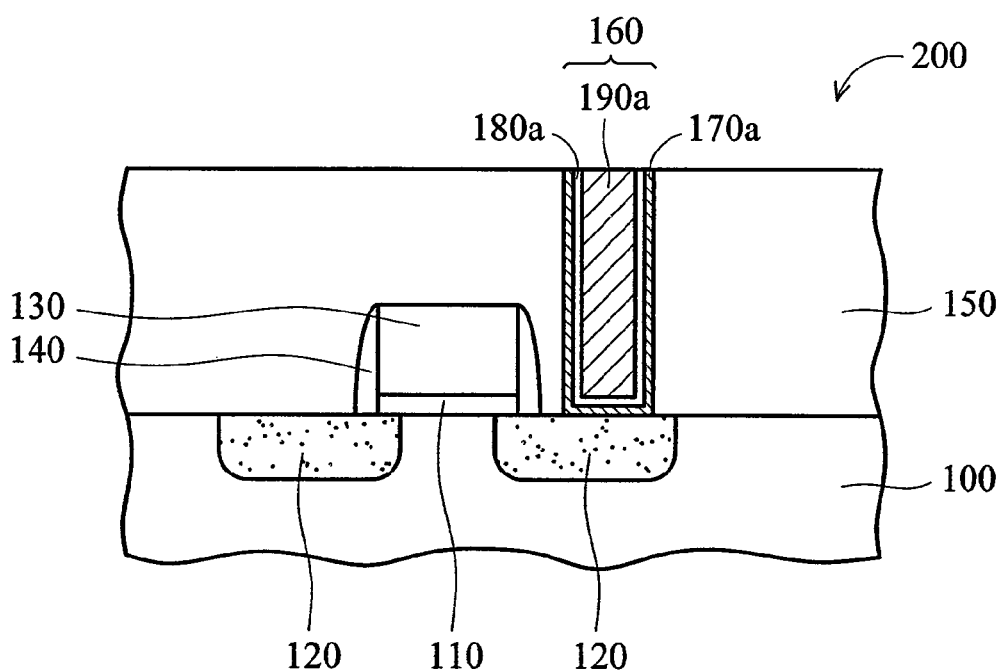

In FIG. 4, a planarization step such as chemical mechanical polishing (CMP) performs to remove the portion of the copper layer 190, copper seed layer 180 and TaN barrier layer 170 above the first dielectric layer 150, leaving a contact plug 200 as an interconnect between the underlying transistor and a substantially formed conductive line (not shown). Herein, the contact plug 200 comprises a conformal TaN barrier layer 170a, a copper layer 190a and a copper seed layer 180a therebetween, contacting the source/drain region 120 of the transistor. In the described planarization step, for example CMP, the TaN barrier layer 170 is thin and can be simultaneously removed during the copper CMP, obviating the need for additional CMP on the TaN barrier layer 170.

Figure 5:
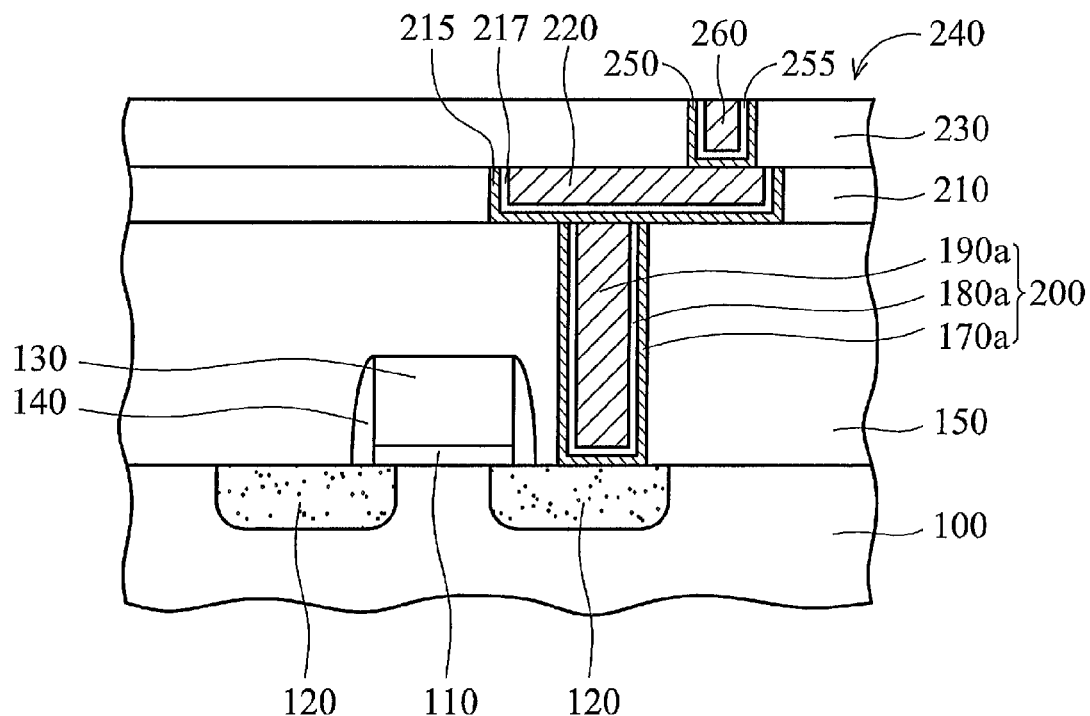

In FIG. 5, a second dielectric layer 210 with a conductive line 220, such as a copper line, formed therewith, is formed over the first dielectric layer 150 by conventional line fabrication. Herein, a conformal metal barrier layer 215 is preferably provided between the conductive line 220 and the second dielectric layer 210. The metal barrier layer 215 can also be a TaN layer formed by the described atomic layer deposition 165. Thickness of the metal barrier layer 215 can be similar with the described TaN barrier layer 170a and thus provides a reliable conductive feature with reduced reduces sizes.

The second dielectric layer 210 can comprise a dielectric material such as phosphosilicate glass (PSG), borophosphosilicate glass (BPSG) or a low-k dielectric material with dielectric constant less than 3.9. A third dielectric layer 230 with a contact via 240 therein is formed over the second dielectric layer 210, the contact via 240 electrically connecting to the conductive line 220. The third dielectric layer 230 can comprise a low-k dielectric material with dielectric constant less than 3.9. The contact via 240 comprises a metal barrier layer 250 and a conductive layer 260, and a seed layer 255 formed by, for example, conventional damascene process. The conductive layer 260 can be a copper layer and the metal barrier layer 250 can also be a TaN layer formed by the described atomic layer deposition 165. Herein, thickness of the metal barrier layer 250 can be similar with the described TaN barrier layer 170a and thus provides a reliable contact via with reduced sizes. Thus, one of the source/drain regions 120 is thus electrically connected by the contact plug 200, the conductive line 220 and the contact via 240 in the upper level.

Figure 6:
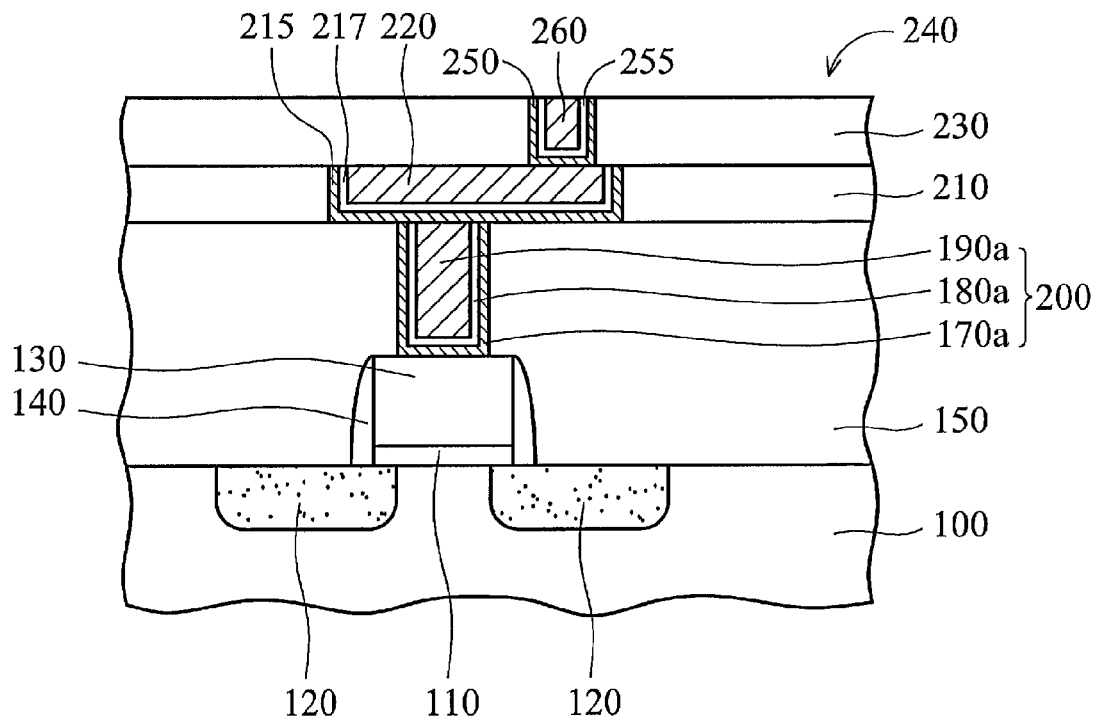

Alternatively, the opening 160 can be formed in a position corresponding to the gate electrode 130 and the contact plug 200 comprised of a conformal TaN barrier layer 170a, a copper layer 190a and a copper seed layer 180a can be sequentially formed therein by fabrication steps illustrated in FIGS. 3-4, as shown in FIG. 6.

In addition, in FIG. 6, the second dielectric layer 210 with a conductive line 220, such as a copper line, and a metal barrier layer 215 formed therebetween, can be subsequently formed over the first dielectric layer 150 to electrically connect the conductive plug 200. Moreover, the third dielectric layer 230 with a contact via 240 comprised of the metal barrier layer 250 and the conductive layer 260, and a seed layer 255 therein can be subsequently formed over the second dielectric layer 210. The contact via 240 electrically connects the conductive line 220.

As shown in FIGS. 4 and 6, a semiconductor device with a copper contact is provided, comprising a substrate with at least one transistor thereon. A first dielectric layer covers the transistor and has an opening exposing an active region of the transistor. A TaN barrier layer is conformably formed in the opening by atomic layer deposition (ALD), having an ultra-thin thickness, and a copper layer is formed over the TaN barrier layer to fill the opening As shown in FIGS. 5 and 6, a copper interconnect is also provided on the semiconductor device, comprising an underlying conductive member (e.g. the conductive line 220) in a second dielectric layer. A third dielectric layer over the second dielectric layer has an opening therein, exposing a portion of the underlying conductive member. A TaN barrier layer conformally forms in the opening by atomic layer deposition (ALD) at minimal thickness, and a copper layer over the TaN barrier layer fills the opening.

The semiconductor devices with copper contact and copper interconnect as disclosed both utilizing an ultra-thin TaN barrier, formed with reduced thickness by ALD, providing optimal step coverage in openings, a reliable diffusion barrier to metals such copper, making it a good choice for use in sub-100 nm semiconductor fabrication technology, and functioning as a diffusion barrier for a structure with smaller CD. The TaN barrier also exhibits maximum adhesion between the copper seed layer and the dielectric layer.

While the invention has been described by way of example and in terms of preferred embodiment, it is to be understood that the invention is not limited thereto To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device, comprising:
   providing a substrate with at least one transistor covered by a first dielectric layer, wherein the first dielectric layer comprises phosphorous-containing dielectric;
   forming a first opening in the first dielectric layer, exposing an active region of the transistor;
   conformably forming a first TaN barrier at a thickness less 20Å in the first opening by atomic layer deposition (ALD); and
   forming a copper layer over the first TaN barrier layer, filling the first opening.

2. The method of claim 1, wherein the phosphorous-containing dielectric is phosphosilicate glass (PSG) or borophosphosilicate glass (BPSG).

3. The method of claim 1, formation of the first TaN barrier comprising alternatively reacting penta-dimethyl-amino-tantalum (PDMAT) and ammonia ($NH_3$) with the first dielectric layer for at least 3 cycles.

4. The method of claim 1, further comprising:
planarizing the copper layer, removing a portion of the copper layer over the first dielectric layer to expose the first dielectric layer and the copper layer in the first opening;
forming a second dielectric layer over the first dielectric layer and the copper layer;
forming a second opening in the second dielectric layer, exposing a portion of the copper layer;
conformably forming a second TaN barrier at a thickness less 20 Å in the second opening by atomic layer deposition (ALD); and
forming a second copper layer over the second TaN barrier, filling the second opening.

5. The method of claim 4, wherein the second dielectric layer comprises low-k dielectric.

6. The method of claim 5, wherein the low-k dielectric has a dielectric constant less than 3.9.

7. The method of claim 4, wherein the second dielectric layer comprises phosphosilicate glass (PSG) or borophosphosilicate glass (BPSG).

8. The method of claim 4, wherein formation of the second TaN barrier comprising:
alternatively reacting penta-dimethyl-amino-tantalum (PDMAT) and ammonia ($NH_3$) with the first dielectric layer for at least 3 cycles.

9. The method of claim 4, further comprising a step of forming a second copper seed layer on the second TaN barrier layer prior to the formation of the second copper layer.

10. The method of claim 1, further comprising a step of forming a copper seed layer on the first TaN barrier layer prior to the formation of the copper layer.

* * * * *